United States Patent

Horiike et al.

[11] Patent Number: 6,155,200
[45] Date of Patent: *Dec. 5, 2000

[54] ECR PLASMA GENERATOR AND AN ECR SYSTEM USING THE GENERATOR

[75] Inventors: Yasuhiro Horiike, 3-2-12, Higashifushimi, Hoya-shi, Tokyo; Kohei Kawamura, Yamanashi-ken, both of Japan

[73] Assignees: Tokyo Electron Limited; Yasuhiro Horiike, both of Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/109,064

[22] Filed: Jul. 2, 1998

[30] Foreign Application Priority Data

Jul. 8, 1997 [JP] Japan ................ 9-196378

[51] Int. Cl.[7] ............ C23C 16/00; H05H 1/00; H05H 1/02
[52] U.S. Cl. .......... 118/723 E; 156/345; 427/571; 118/723 MR; 118/723 MA
[58] Field of Search ............... 156/345; 118/723 R, 118/723 I, 723 E, 723 FE, 723 MR, 723 MA; 315/111.21, 111.41, 111.71, 85; 427/534, 569, 575, 571; 438/710, 726, 728, 732; 216/67, 68, 69, 70, 71

[56] References Cited

U.S. PATENT DOCUMENTS

| | | | |
|---|---|---|---|
| 5,266,153 | 11/1993 | Thomas | 156/345 |
| 5,431,769 | 7/1995 | Kisakibaru et al. | 156/345 |
| 5,585,012 | 12/1996 | Wu et al. | 156/345 |
| 5,607,542 | 3/1997 | Wu et al. | 156/345 |

*Primary Examiner*—Gregory Mills
*Assistant Examiner*—P. Hassanzadeh
*Attorney, Agent, or Firm*—Oblon, Spivak, McClelland, Maier & Neustadt, P.C.

[57] ABSTRACT

In an ECR plasma generator, radio frequency ranging from 3 to 300 MHz is applied from a radio frequency power supply to an electrode which is provided in a chamber having an exhaust system and which serves as a shower head for gas introduction, and power is supplied to a coil provided at the outer periphery of the chamber, so as to form a magnetic field an integer number of times as large as a resonant magnetic field corresponding to the applied radio frequency, parallel with the direction of an electric field and to generate ECR plasma in an atmosphere of the supplied process gas.

10 Claims, 2 Drawing Sheets

ECR PLASMA GENERATOR AND AN ECR SYSTEM USING THE GENERATOR

BACKGROUND OF THE INVENTION

The present invention relates to a system using a plasma generator in the ECR (Electron Cyclotron Resonance) type, and more particularly, to an ECR plasma generator as an apparatus for deposition and etching on an object to be processed, for example, a semiconductor wafer and an ECR system using the ECR plasma generator.

For example, as a conventional system for etching in a desired shape desired portions of a thin film formed on a semiconductor wafer, dry etching apparatuses are known. An etching comprising parallel plate type electrodes is more popular among them, and the RIE (reactive ion etching) type apparatus and the PE (plasma etching) type apparatus are well known.

In either type, etching gas (reactive gas) is introduced into an etching chamber reduced in pressure to generate plasma so that a thin film on the semiconductor wafer can be etched. The gas pressure is set to be comparatively high, i.e. some hundreds mTorr or higher.

In the etching process under such a comparatively high pressure atmosphere, reactive by-products fly in the chamber as dust (particles). If they fall down on the semiconductor wafer, they will cause drawbacks in the circuit pattern during the production, which degrades the yield of the products.

In the RIE type apparatus, since the physical etching is mainly carried out, ions of high energy, for example, 500–600 eV, are irradiated onto the semiconductor wafer, and the semiconductor wafer may be thereby damaged.

On the other hand, recently, a magnetron plasma system which generates high-density plasma in a comparatively low pressure atmosphere and uses it for deposition and fine etching has been used in practice.

According to this system, the magnetic field is applied horizontally to the semiconductor wafer and the radio frequency field rectangular with the semiconductor wafer is also applied, so as to generate the magnetron discharging for the etching.

In this system, however, since the magnetic field is applied horizontally to the semiconductor wafer, charged particles drift essentially in the direction of the magnetic field, i.e. E×B drift occurs.

As a result, there is an essential problem that the plasma density can be unbalanced and irregular at the downstream side and upstream side of the transported charged particles, which causes the charge-up damage of the semiconductor wafer.

On the other hand, a system using the ECR plasma generator as a plasma generator improving the plasma density by using the magnetic field forming technique that can hardly generate essentially the irregularity of plasma caused by the E×B drift, has been proposed.

When this system is used, however, since the used frequency is the microwave of some GHz, the resonant magnetic field becomes extremely large. For example, the resonant magnetic field corresponding to the microwave of 2.45 GHz is 875G (G: gauss), which requires a large-size magnet, and the system is not realistic.

Further, large power needs to be supplied to the process chamber. In this case, a waveguide has to be used, which makes the structure of the apparatus complicated.

In order to solve these problems, it is conceived to lower the frequency of the applied radio frequency wave. In this case, however, the Lamor radius of electrons becomes large, the electrons collide with the process chamber walls before the cyclotron movement and thereby lose their energy, which makes it difficult to improve the plasma density.

BRIEF SUMMARY OF THE INVENTION

The object of the present invention is to provide a small-size ECR plasma generator that can generate uniform and high-density plasma without a large-size magnet or a complicated equipment structure, and also an ECR system using the ECR plasma generator.

In order to solve the problem, the present invention provides an ECR plasma generator including a plasma chamber which has an exhaust system and whose reduced pressure state can be maintained, a process gas supply system for introducing the process gas into the plasma chamber, first radio frequency applying means for applying arbitrary radio frequency within a range of 3 to 300 MHz to a first electrode provided in the plasma chamber, and magnetic field forming means for forming a magnetic field an integer number of times as large as a resonant magnetic field corresponding to the applied radio frequency, parallel to the direction of the electric field, from the outer periphery of the plasma chamber.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate a presently preferred embodiment of the invention and together with the general description given above and the detailed description of the preferred embodiment given below, serve to explain the principles of the invention.

DETAILED DESCRIPTION OF THE INVENTION

Figure 1:
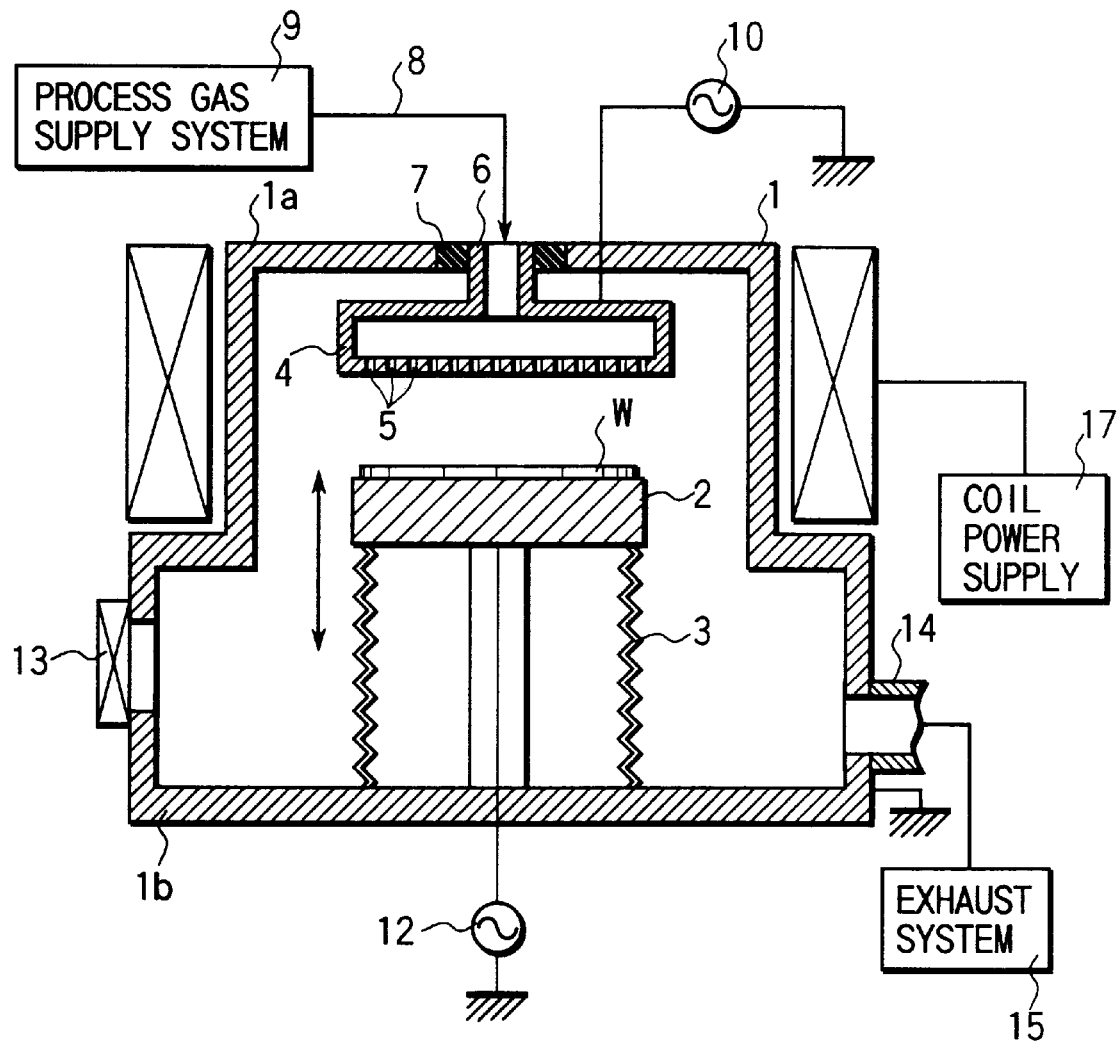
FIG. 1 shows an example of a structure of an ECR system using an ECR plasma generator according to a 1st aspect of the present invention, applied to an ECR etching system.

The aspects of the present invention will be described below in detail by referring to the drawings.

First, a concept of the ECR plasma generator of the present invention will be described before the aspects thereof.

When the radio frequency in the ultrashort wave range of, for example, 27.12 MHz is applied in the ECR plasma generator, the intensity of the resonant magnetic field is about 10G (G: gauss). If the sheath accelerating voltage is 1000V, under this condition, the Lamor radius is about 9 cm, which is 140 times as large as that when the radio frequency in the microwave range of 2.45 GHz is applied.

However, if the intensity of the magnetic field is multiplied to be an integer number of times as large as the resonant magnetic field, the same plasma as that obtained when the resonant frequency is multiplied at the integer number of times is generated (Japanese Journal of Applied Physics Vol.29, No.11, 1990, pp2641–2643).

That is, it is possible to reduce the only Lamor radius to one divided by an integer number with the frequency remaining. Therefore, energy loss can be prevented even if the frequency of the applied radio frequency wave is small.

In this case, even if the magnetic field is set to be an integer number of times, it may be at most about 100G, and only a small magnet is needed. The reason why the frequency of the applied radio frequency wave is set in a range from 3 to 300 MHz is that the magnetic field is small in this range and that this range is a range from VHF to UHF, which makes supply of the power easy for constitution of the plasma generator. The frequency of 150 MHz or lower, in this range, is preferable, and that of 100 MHz or lower is particularly preferable from the viewpoint of reduction of abnormal discharging and loss of power.

FIG. 1 shows an example of applying the ECR plasma generator according to a 1st aspect of the present invention to an ECR etching system.

This ECR etching system is constituted to be capable of keeping the vacuum state by stainless or alloyed aluminum, etc. and comprises a chamber 1 in which the vacuum state of a stepped shape (for example, a cylindrical shape with steps) connecting an upper plasma chamber 1a with a small diameter to a lower sub-chamber 1b with a large diameter. The electric potential of the chamber 1 is grounded.

The plasma chamber 1a comprises a shower head 4 provided on the ceiling wall of the plasma chamber 1a, a radio frequency power supply 10 connected to the shower head 4 via a matching circuit (not shown), a process gas supply system 9 for supplying the process gas to the shower head 4, a support table (susceptor) 2 for holding an object to be processed, for example, a semiconductor wafer W disposed at a position to which the generated plasma is taken up and irradiated, an air-core coil 11 provided coaxially at the outer periphery of the plasma chamber 1a, and a coil power supply 17 for supplying power to the air-core coil 11 to make it function as an electromagnet. These constitute the plasma generator of the present invention.

The shower head 4 has a number of gas outlet holes 5 at its lower surface and a gas introducing portion 6 at its upper part.

The gas introducing portion 6 is attached to the ceiling wall of the plasma chamber 1a via an insulating member 7. The gas supply pipe 8 is connected to the gas introducing portion 6. The other end of the gas introducing portion 6 is connected to the process gas supply system 9, which supplies the process gas formed of the reaction gas used for, for example, etching, and the diluent gas.

When the plasma generator is used for etching, for example, halogen containing gas such as $CHF_3$, $CF_4$ and $C_4F_8$, CO gas, $O_2$ gas, etc. are used as its process gas, and inert gas such as Ar gas is used as the diluent gas.

Use of the process gas allows the etching of, for example, an oxide film formed on the semiconductor wafer W.

The radio frequency power supply 10 has the frequency ranging from 3 to 300 MHz. By supplying the radio frequency power of the frequency in this range by use of the radio frequency power supply 10, a vertical radio frequency electric field of 3 to 300 MHz is formed in the plasma chamber 1a.

The air-core coil 11 serves as an electromagnet in response to the power supplied from the coil power supply 17, and forms a vertical magnetic field parallel to the radio frequency electric field inside the plasma chamber 1a. In this case, the power supplied to the air-core coil 11 is adjusted so that the magnitude of the magnetic field can be an integer number of times as large as the resonant magnetic field of the radio frequency applied from the radio frequency power supply 10. It is assumed that, for example, the wavelength of the radio frequency supplied from the radio frequency power supply 10 is set at 27.12 MHz. The resonant magnetic field at this time is about 10G, and therefore, the vertical magnetic field is set at integer times 10G, i.e. 20G, 30G, 40G, . . . .

Under these conditions the electron cyclotron resonance is generated, and the ECR plasma is generated in the plasma chamber 1a.

The support table 2 is disposed opposite to and parallel with the shower head 4, and is provided to hold horizontally the semiconductor wafer W and lift up and down by means of a lift mechanism (not shown). As the holding manner, any desired ones such as a vacuum chuck, an electrostatic chuck, and a clamp ring may be employed.

A drive portion for allowing the support table 2 to move up and down is provided under the support table 2 and is covered with a bellows 3. The support table 2 has a cooling function so as to be at a desired temperature. For example, a refrigerant channel (not shown) is provided in the support table 2, and the support table 2 can be cooled by flowing the refrigerant of an arbitrary temperature.

In addition, a radio frequency power supply 12 is connected to the support table 2 via a matching circuit (not shown). The frequency of the radio frequency power supply 12 is set at, for example, about 5 MHz so that ions in the plasma are taken toward the semiconductor wafer W.

A gate valve 13 is provided at one side wall of the sub-chamber 1b, and the semiconductor wafer W is carried onto or out from the support table 2 falling down, through the gate valve 13. In addition, an exhaust port 14 is provided at the other side wall of the sub-chamber 1b, and an exhaust system 15 is connected to the exhaust port 14. By operating a vacuum pump provided at the exhaust system 15, the pressure in the chamber 1 can be reduced to a desired degree of vacuum.

Next, operations of the ECR etching system thus constituted will be described.

First, the radio frequency power of a predetermined frequency ranging from 3 to 300 MHz is supplied from the radio frequency power supply 10 to the shower head 4 to form the radio frequency electric field inside the chamber 1 and supply power to the air-core coil 11 so that a vertical magnetic field can be formed inside the plasma chamber 1a.

After the air in the chamber 1 is exhausted by the exhaust system 15 and the pressure therein is reduced, predetermined gas from the process gas supply source 9 is introduced from the shower head 4 into the plasma chamber 1a to generate the plasma.

The frequency of the radio frequency power supplied from the radio frequency power supply 10 is set to be an arbitrary one ranging from 3 to 300 MHz.

At this time, the vertical magnetic field generated by the electromagnet of the air-core coil 11 is formed to be an integer number of times as large as the resonant magnetic field in the frequency of the applied radio frequency wave. For example, the resonant magnetic field is 21.45G when the frequency of the applied radio frequency wave is 60 MHz or about 10G when the applied radio frequency is 27.12 MHz. The vertical magnetic field is formed at, for example, double these, i.e. 42.9G or 20G.

As described here, if the intensity of the magnetic field is increased to be integer times the resonant magnetic field, for example, two times, the same advantage as that obtained when the resonant frequency is doubled can be obtained. That is, it is possible to reduce only the Lamor radius of electrons to half the value while keeping the applied frequency unchanged.

As a result, it is possible to solve the problem about the loss of energy caused in accordance with the increase in the Lamor radius of electrons, and also possible to obtain the plasma at high density.

For example, when the radio frequency in the ultrashort wave range of 27.12 MHz is applied, the resonant magnetic field is about 10G. The Lamor radius of electrons under this condition is large, i.e. about 9 cm if the sheath accelerating voltage is set at 1000V, and the electrons may collide with the chamber wall very frequently. However, when the intensity of the magnetic field is doubled, i.e. 20G, the same plasma as that obtained when the resonant frequency is doubled is formed and the Lamor radius of electrons is about 4.5 cm, which causes the electrons to collide with the chamber wall very rarely and the plasma density to be increased.

By supplying the radio frequency power of, for example, 5 MHz from the radio frequency power supply 12 to the support table 2 while forming the plasma, ions in the plasma are taken into the semiconductor wafer W, and a film formed on the semiconductor wafer W is etched or a film is formed on the semiconductor wafer W.

In the present aspect, since the magnetic field is applied parallel to the direction of the electric field, the E×B drift that occurs when it is applied vertically with the direction of the electric field occurs rarely in the sheath area near the semiconductor wafer W except for the components of the thermal motion rate of electrons.

As a result, the irregularity of plasma caused by the E×B drift becomes reduced in principle, and the problem of charge-up damage can be thereby solved.

That is, in the case of the horizontal magnetic field, the charged particles move in both directions of the semiconductor wafer W by the E×B drift, and consequently the plasma density becomes irregular in accordance with the position of the semiconductor wafer W. In the case of the vertical magnetic field, however, since the charged particles move vertically onto the surface of the semiconductor wafer W, such irregularity does not occur if the distribution of the magnetic field is uniform on the surface.

Further, since the radio frequency ranging 3 to 300 MHz that is slightly lower than the frequency in the conventional ECR system is able to be used as described above, a large magnetic field is not required, and a large-sized and complicated constitution of the apparatus is not required since large power is unnecessary.

Moreover, there is advantage that the power can be easily supplied with the frequency of this range. can be reduced when the frequency is 100 MHz or lower, and therefore, this frequency range is particularly preferable. Difficulty in obtaining the uniformity of plasma when the radio frequency in the microwave range is used can be solved, and high-density plasma can be formed.

Next, operations of the plasma generator serving as an ECR etching system will be described.

First, while keeping the gate valve 13 opened, the semiconductor wafer W is carried into the chamber 1 by a carrier arm (not shown) and placed on the support table 2 which has fallen down. After the carrier arm has retreated outside the chamber 1, the gate valve 13 is closed.

Next, the support table 2 is lift up to set the distance between the semiconductor wafer W and the shower head 4 (the ECR side surface) to a predetermined one, for example, 50 mm. In this case, refrigerant is flown in the support table 2 to keep the temperature of the semiconductor wafer W at a predetermined one, for example, about 20 C. The temperature of the side wall of the chamber 1 and the shower head 4 is set to be kept at, for example, about 60°C.

After that, the radio frequency power is supplied from the radio frequency power supply 10 to the shower head 4 to form the radio frequency electric field, and at the same time, the vertical magnetic field is formed by the air-core coil 11.

The interior of the chamber 1 is exhausted by use of the vacuum pump of the exhaust system 15 so as to reduce the pressure in the chamber 1 to about $10^{-5}$ to $10^{-6}$ Torr, a predetermined flow of the process gas including the reactive gas and diluent gas is supplied from the process gas supply system 9 into the chamber 1 through the shower head 4, and etching is started at the pressure of, for example, 10 to 40 mTorr.

At this time, the flow of the process gas is: for example, $CF_4$ gas at 10 sccm; CO gas at 50 sccm; $O_2$ gas at 5 sccm; and Ar gas at 200 sccm.

At the same time, the frequency of the radio frequency power supplied from the radio frequency power supply 10 is set to be in the range from 3 to 300 MHz, preferably 150 MHz or lower, and more preferably 100 MHz or lower.

After that, the high-density plasma is generated inside the plasma chamber 1a as described above. By supplying the radio frequency power of, for example, 5 MHz from the radio frequency power supply 12 to the support table 2 while forming such plasma, the ions in the plasma are taken into the semiconductor wafer W, and the film formed on the semiconductor wafer W, for example, an oxide film ($SiO_2$) is etched.

Figure 2:
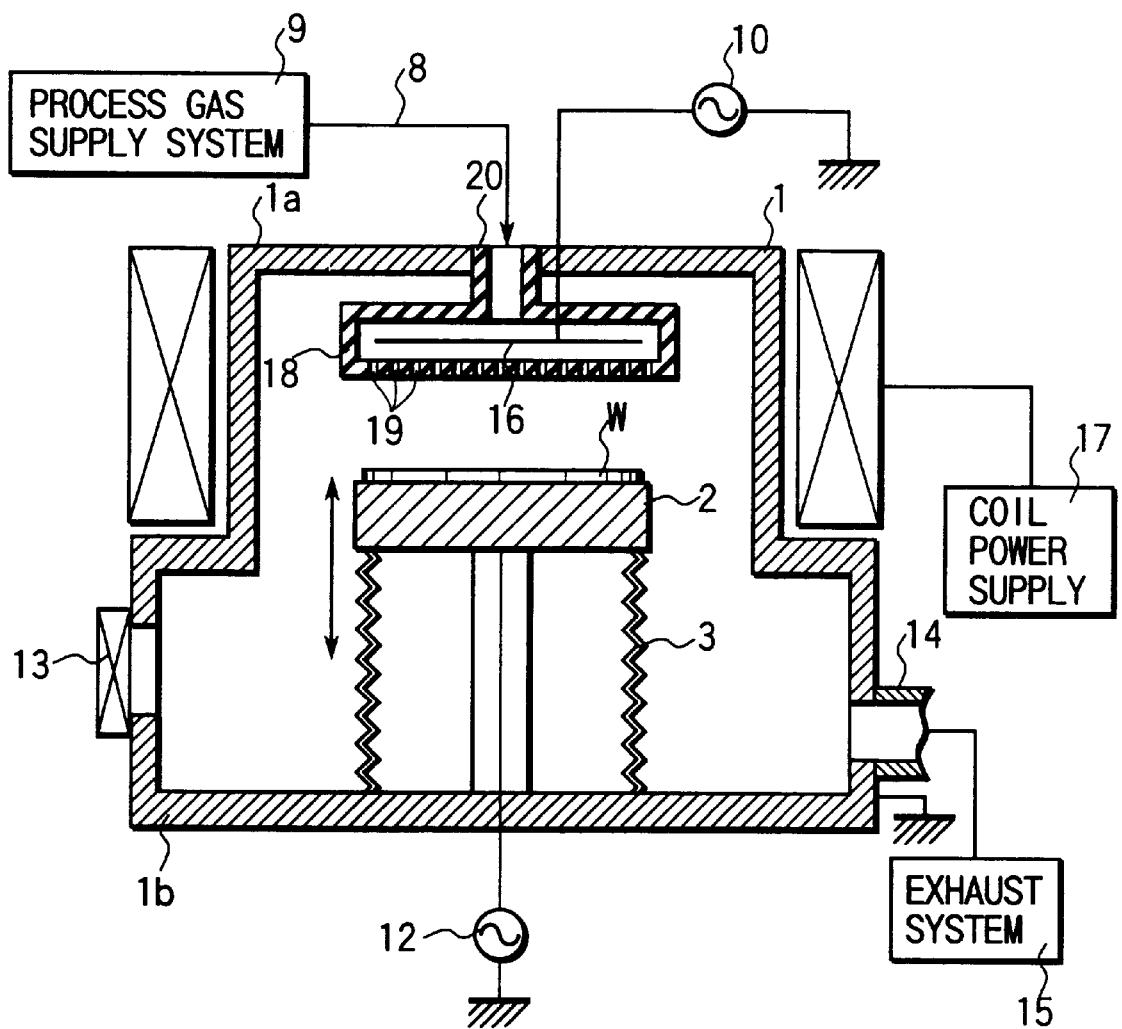
FIG. 2 shows an example of a structure of an ECR system using an ECR plasma generator according to a 2nd aspect of the present invention, applied to an ECR etching system.

FIG. 2 shows an example of applying an ECR plasma generator according to a 2nd aspect of the present invention to an ECR etching system. The present aspect relates to an inductive coupling type ECR etching system. The same constituent elements as those shown in FIG. 1 are represented by the same reference numerals in FIG. 2 and their explanation is omitted.

In the present aspect, a shower head 18 formed of an insulating material is used instead of the shower head 4 of the 1st aspect. A gas introducing portion 20 formed of an insulating material is connected to the shower head 18.

Gas outlet holes 19 for emitting the gas supplied from the process gas supply system 9 are formed on the lower surface of the shower head 18.

An electrode 16 is provided horizontally (with the semiconductor wafer on the support table 2) in the inner space of the shower head 18, and the radio frequency power supply 10 is connected to the electrode 16.

In the present aspect, the radio frequency electric field is formed by applying the radio frequency power from the radio frequency power supply 10 to the electrode 16.

The kind of the process gas and the diluent gas is not limited to the examples cited above, and various kinds of gases may be used independently or in combination in accordance with the quality of the film which is processed by etching. In addition, the diluent gas is not definitely necessary. In accordance with selection of the process gas, the etched film can be applied to various films other than the oxide film.

Further, as the object to be processed, a liquid crystal display substrate and the like may be used other than the semiconductor wafer.

In the present aspect, the example of applying the ECR plasma generator of the present invention to the ECR etching system has been described above. As clearly understood, however, a person skilled in the art can easily apply it to deposition apparatus by selecting the process gas. For example, various gases cited below can be selected:

$SiH_4+O_2 \rightarrow SiO_2$ $WF_6+H_2 \rightarrow W$ $TiCl_4+NH_3 \rightarrow TiN$.

In addition, the plasma generator can be also applied as a PVD system by disposing a target so that the target faces the semiconductor wafer in the chamber.

As described above, according to the present invention, the ECR plasma generator is applied to the ECR system (etching or deposition). Since the magnetic field is applied vertically with the object to be processed at the processing time, irregularity of plasma based on the E×B drift does not occur substantially and the problem about the charge-up damage can be solved.

Moreover, since the frequency ranging from 3 to 300 MHz that is slightly lower than the frequency in the conventional ECR plasma generator is used, a large magnetic field is not required, and the structure of the apparatus does not need to be complicated since large power is unnecessary.

Furthermore, difficulty in keeping the uniformity of plasma, which is found when the radio frequency in the microwave range is used, can be solved, and highdensity plasma can be formed.

With the frequency ranging from 3 to 300 MHz, the power can be easily supplied. In addition, abnormal discharging and the loss of power can be reduced by lowering the frequency of the applied radio frequency wave below 100 MHz.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ECR plasma generation process for use in an ECR plasma generator, said process comprising:

providing a plasma chamber which has an exhaust system and whose reduced pressure state can be maintained;

introducing process gas into said plasma chamber via a process gas supply system;

applying an arbitrary radio frequency ranging from 3 to 300 MHz to a first electrode provided in said plasma chamber via a first radio frequency applying means; and forming a magnetic field an integer number of times as large as a resonant magnetic field corresponding to the applied radio frequency, parallel to the direction of the electric field, from the outer periphery of said plasma chamber via a magnetic field forming means.

2. The process according to claim 1, further comprising:

providing as said process gas introducing means a conductive body comprising a shower head at which a number of gas outlet holes are formed; and using said shower head as said first electrode.

3. The process according to claim 1, further comprising:

providing a susceptor disposed opposite to and parallel with said electrode in said plasma chamber;

providing a second radio frequency power supply connected to said susceptor; and using the susceptor to which the radio frequency is applied to absorb the plasma in a stream shape.

4. The process according to claim 1, further comprising:

applying a radio frequency of 27.12 MHz via said first radio frequency applying means; and forming a magnetic field an integer number of times as large as a resonant magnetic field at 10G (G: gauss), parallel with a direction of an electric field via said magnetic field forming means.

5. The process according to claim 2, further comprising:

forming said shower head of an insulating material; and providing said first electrode in a space inside said shower head.

6. An ECR process for use in an ECR system having an ECR plasma generator, said process comprising:

providing a chamber having a plasma chamber portion and a sub-chamber portion connected integrally to each other, comprising an exhaust system;

maintaining said chamber in a reduced pressure state;

supplying process gas into said plasma chamber portion via a process gas supply system;

introducing the process gas supplied from said process gas supply system into said plasma chamber portion in a shower state via a shower head insulated from said chamber and formed of a conductor;

using said shower head as a first electrode;

applying arbitrary radio frequency ranging from 3 to 300 MHz to the first electrode provided in said plasma chamber via a first radio frequency power supply;

holding a object to be processed via a susceptor disposed opposite to and parallel with said shower head in said sub-chamber portion;

using said susceptor as a second electrode;

forming a magnetic field an integer number of times as large as a resonant magnetic field corresponding to the applied radio frequency, vertically with said object to be processed and parallel to the direction of the electric field, from the outer periphery of said plasma chamber via a magnetic field forming means; and applying a radio frequency for allowing ions in the plasma to be irradiated to said object to be processed in a stream shape via a second radio frequency power supply connected to said susceptor.

7. The process according to claim 6, further comprising:

forming said shower head of an insulating material; and providing said first electrode in a space inside said shower head.

8. The process according to claim 6, further comprising:

setting the radio frequency applied by said first radio frequency power supply at 100 MHz or lower.

9. The process according to claim 6, further comprising:

supplying a halogen-containing gas including $CHF_3$, $CF_4$ or $C_4F_8$ and dilutant gas containing CO gas, $O_2$ gas, and inert gas including Ar gas or reactive gas corresponding to the film formed on said object to be processed that is to be etched into the chamber as said process gas; and using said system as an ECR etching system.

10. The process according to claim 6, further comprising:

supplying a reactive gas which includes $SiH_4+O2$, $SiO_2$, $WF_6+H_2$, $TiCl_4+NH_3$ and $SiF_4+O_2$ and which corresponds to a film deposited on said object to be processed as said process gas; and using said system as an ECR deposition system.

* * * * *